US005387874A

United States Patent [19]

Rapeli

[11] Patent Number: 5,387,874

[45] Date of Patent: Feb. 7, 1995

[54] METHOD AND CIRCUIT FOR DYNAMIC VOLTAGE INTERGRATION

[75] Inventor: Juha Rapeli, Oulu, Finland

[73] Assignee: Nokia Mobile Phones Ltd., Salo, Finland

[21] Appl. No.: 41,913

[22] Filed: Apr. 2, 1993

Related U.S. Application Data

[63] Continuation of Ser. No. 752,864, Aug. 30, 1991, abandoned.

[30] Foreign Application Priority Data

Aug. 30, 1990 [FI] Finland ........ 904281

[51] Int. Cl.[6] ........ H03K 5/00

[52] U.S. Cl. ........ 327/337; 327/91; 327/94; 327/336

[58] Field of Search ........ 328/127, 128, 151; 307/228, 352, 353, 227

[56] References Cited

U.S. PATENT DOCUMENTS

| | | | |
|---|---|---|---|
| 3,286,100 | 11/1966 | Worthington | 307/88.5 |
| 3,535,645 | 11/1970 | Kinbara | 328/127 |
| 4,334,195 | 6/1982 | Luce | 328/151 |
| 4,352,069 | 9/1982 | Dessoalary | 328/127 |
| 4,361,769 | 11/1982 | Hatchett | 307/353 |
| 4,400,637 | 8/1983 | Klar et al. | 328/127 |
| 4,746,871 | 5/1988 | de la Plaza | 328/127 |
| 4,754,226 | 6/1988 | Lasignan et al. | 329/127 |
| 4,978,872 | 12/1990 | Morse et al. | 307/353 |
| 5,021,692 | 6/1991 | Hughes | 307/353 |

FOREIGN PATENT DOCUMENTS

| | | |
|---|---|---|
| 0341691 | 11/1989 | European Pat. Off. . |
| 0386261 | 9/1990 | European Pat. Off. . |
| 2758508 | 7/1978 | Germany . |
| 2933667 | 3/1981 | Germany . |
| 2035723 | 6/1980 | United Kingdom . |

OTHER PUBLICATIONS

Yoshiko Horio, et al., Switched-Capacitor Pre-Processor For Speeh Processing Using SC CIC Filter IEEE International Symposium on Circuits and Systems, May, 1989, 1311-1314.

*Primary Examiner*—Timothy P. Callahan
*Assistant Examiner*—T. T. Lam
*Attorney, Agent, or Firm*—Darby & Darby

[57] ABSTRACT

An integrating circuit is formed in the present invention, of which the active element is a pair of bipolar transistors (T5/T6) or a CMOS transistor (T8) which with the aid of switches (s81 to s88) controls the storing of a sample charge from the signal voltage (Us) in a sampling capacitor (Ci) and the discharging of the sample into an integrating capacitor (Co). The circuit only consumes current while charges are being transferred.

7 Claims, 5 Drawing Sheets

Vd
Vs
Uci
Us
Uco
Ube1
Ube2
Ube3
Ube4
t
+
-

METHOD AND CIRCUIT FOR DYNAMIC VOLTAGE INTERGRATION

This is a continuation, of application Ser. No. 07/752,864, filed Aug. 30, 1991, now abandoned.

BACKGROUND OF THE INVENTION

The present invention relates to a method and circuit for producing a time integral of a signal voltage, and, more particularly, where charge samples of the signal voltage are stored in a sampling capacitance and discharged into an integrating capacitance at a predetermined switching interval.

The voltage integrator is an ordinary circuit implemented, for example, using the CMOS technique. This is demonstrated by a prior art circuit shown in FIG. 1*a* using an operational amplifier. FIG. 1*b* shows an alternative prior art implementation using capacitors switched in discrete time. The output signal Uo of the integrators shown in FIG. 1*a* is the time integral of the input voltage Ui. The integral is derived according to following the formula:

$$Uo(t)=-(1/RC)\int^{t}_{o} Ui(t)dt$$

Similarly, the output signal Uo of the integrator shown in FIG. 1*b* is derived:

$$Uo(t)\approx fs\cdot(Ci/Co)\int^{t}_{o} Ui(t)dt$$

where fs is the sampling frequency. When switches s1 and s4 are closed, and switches s2 and s3 are open, the sampling capacitance Ci stores a charge sample of the input signal. The sample charge ($Qi=Ci\times Ui$) is discharged in the integrating capacitor Co by closing the switches s2 and s3 and switches s1 and s4 are open. There may be pauses between the sample storing and sample discharge stages when all four switches are open.

A drawback of these prior art circuits is that the amplifier continuously consumes power. Moreover, the amplifier's bandwidth is limited in proportion to this power consumption, and the CMOS implementation is susceptible to 1/f noise.

SUMMARY OF THE INVENTION

The method and circuit according to the present invention avoid these drawbacks. The design of the present invention permits the integrated circuits to be implemented without consuming any static current.

As taught by the present invention, the integrating capacitance is isolated from the circuit by opening the switching elements after discharging each charge sample. In addition, the active members are switched in conductive connection with the supply voltage terminals only for storing the sample charge in the sampling capacitance, and discharging the sample charge into the integrating capacitor. A circuit based on this design needs no active amplifier, but rather, the charge transfer from the sampling capacitance to the integrating capacitance is controlled by switching elements which, according to the invention, connect one of the sampling capacitance terminals to either the positive or the negative supply voltage. When the charge transfer is concluded, the current stops entirely, thus eliminating the constant consumption of current.

According to a preferred embodiment, the sampling capacitance is precharged by connecting it to the positive or the negative supply voltage for storing the sample charge.

A preferred method of the present invention includes two charge sample discharge stages, whereby at the first stage a charge sample is conducted to an integrating capacitance only if it has a first sign (e.g., positive or negative), and whereby to the capacitance integrating a charge sample at the next stage is conducted only if it has the opposite sign (e.g., negative or positive), wherein the first sign is preselected. The sign of the charge of a sampling capacitance can be identified with a comparative circuit member, where depending on the identified sign, only one of the two charge sample discharging stages is carried out.

In one embodiment of the integrated switching according to the present invention, the invention is implemented using a transistor as the switching element for controlling the logic operation for discharging a sample charge. In this embodiment, the switching element connecting the sampling capacitance to the supply voltage is a bipolar transistor. In an alternative embodiment, the switching element is a FET transistor.

In a preferred embodiment, the switching element is an EPROM-type FET transistor having floating gate arranged to carry a predetermined charge so that the threshold voltage of the FET transistor is of a desired magnitude, most preferably substantially zero. Here, the circuit operates almost ideally because, e.g., the threshold voltage compensation needed for bipolar transistors is avoided.

BRIEF DESCRIPTION OF THE DRAWINGS

FIG. 3*c* shows a voltage graph of the operation;

FIG. 5*a* shows the change in signal voltage and the voltage across the sampling capacitor at various operational stages of the integrating circuit. FIG. 5*b* shows the change in voltage across the integrating capacitor;

DESCRIPTION OF PREFERRED EMBODIMENTS

Figure 2A:
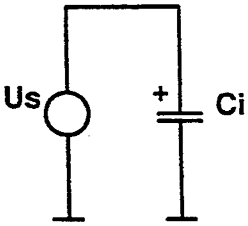
FIGS. 2*a*, 2*b*, and 2*c* show highly simplified circuit diagrams representing the stages of one method according to the present invention.

FIG. 2 uses simplified circuit diagrams to show the stages of the method according to the present invention. In FIG. 2*a*, a sample (being either positive or negative) from an input signal Us is stored in a sampling capacitor Ci. The sample charge $Qi=Us\times Ci$. For the sake of simplicity, it is assumed that the sampling charge is positive, which is indicated by the + sign of one of the capacitor terminals. However, the sample may also be negatively charged. The other capacitor terminal is grounded at this stage.

Figure 2B:
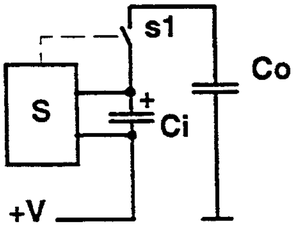
Figure 2C:
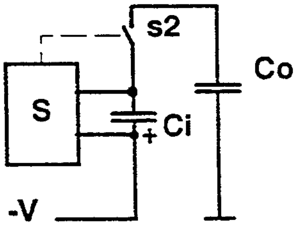

During the second stage, shown in FIG. 2*b*, the positive charge of the sampling capacitor is discharged into an integrating capacitor Co by connecting the negative terminal of the sampling capacitor (in the present embodiment) to the positive supply voltage +V and connecting the other (positive) terminal to the integrating capacitor Co by closing switch s1. A detector S is connected across Ci and keeps the switch s1 closed until the voltage of Ci is reduced to a predetermined limit, preferably zero, whereby the detector S opens the switch s1. Thus, the charge of the sampling capacitor Ci is transferred into the integrating capacitor Co. Were the sample charge negative, nothing would happen at this stage. The third stage, shown in FIG. 2*c*, is arranged by connecting the sampling capacitor Ci to the negative supply voltage -V to discharge the negative sample charge; if the charge is positive, nothing would take place at this stage.

The second (2*b*) and third (2*c*) stages of the method, as shown in FIG. 2, are controlled by detector S, which ensures that sampling capacitor Ci discharges to a predetermined limit.

The method may be altered so that detector S indicates the sign (e.g., positive or negative) as early as the first stage. This allows the second and third stages to be combined, which means that only one stage is carried out as dictated by the sign of the sample charge.

The detector S could be a comparative member such as an operational amplifier or a comparator. When implemented in the above manner, the method according to the present invention would not give a significantly improved result over the prior art method shown in FIG. 1*b* because the amplifier noise would, at very low signals for example, cover the signal. Instead, an advantage of this embodiment of the invention is that the active element is only loaded by the input capacitances of the switches, not by the much larger integrating capacitor Co. In the circuit and the method of the present invention, the greatest advantage is that during the stages shown in FIG. 2, the supply voltage is only loaded by the detector S and switches s1, s2. Even this result can be improved by, for example, using a single CMOS or bipolar transistor, as described below.

FIG. 3 uses simplified circuit diagrams to show the invention using switching members s11–s42 and bipolar transistors T1–T4 based on the BiCMOS technique. FIG. 3 illustrates the operation of the integrating circuit at various stages of the method. All significant components are shown in FIG. 3, but FIGS. 3*a*, 3*b*, 3*d*, 3*e* show only those components essential at each stage. The switching elements included in the circuit are controlled by means of devices and circuit designs familiar to those skilled in the art, so that the control members are omitted for clarity. The switching elements can also be implemented using the devices known to those skilled in the art, for instance by mechanical contacts or semiconductor switches. The signs (polarity, e.g., positive or negative) of the signals and voltages are indicated relative to earth potential (ground).

The operation is described below through six different operation stages. In practice, the stages can either be carried out as a time sequence, whereby different components are used at different moments in time for a different purpose; or using different components in all stages, so different stages can be carried out simultaneously. The earth potential (ground) is assumed to be zero volts and the supply voltage polarities (positive Vd and negative Vs) are relative to the earth potential (ground).

During stage 1 (FIG. 3*a*), Ci is charged to voltage Vd (the positive supply voltage) relative to earth potential (ground) by closing the switch s10. The rest of the switches are now open. Thereafter, at stage 2 (FIG. 3*a*) voltage Uci(2)=Us(2)+Ube1 is charged in the sampling capacitor Ci, where Us is the signal voltage and Ube1 the base emitter voltage of the transistor T1 at the moment when power consumption through the transistor T1 during stage 1 stops. The parenthetical marking "(2)" of the capacitor Ci subsequent to the voltage Uci, indicates the status during stage 2 and the plus sign in the figure refers to the positive pole of the capacitor at each stage. Parenthetical indications of other stages are used below. At stage 2, the collector of the transistor T1 is connected to the negative supply voltage Vs and the switches s11 and s12 are closed.

During stage 2 it is assumed that Us≧0, whereby Uci≧Ube1.

During stage 3 (FIG. 3*b*) the charge on the sampling capacitor Ci is discharged into the integrating capacitor Co by closing switch s21 to connect the other terminal of the sampling capacitor Ci through transistor T2 to the positive supply voltage Vd. The base of the transistor T2 is connected over the sampling capacitor Ci, so that the passage of the current, or transfer of the charge, ends when the voltage across Ci is Uci(2)=Ube2, where Ube2 is the base emitter voltage of the transistor T2. At stage 3, the switches s21 and s22 have been closed. An additional charge dQ transferred to the integrating capacitor at stage 3 is therefore (assuming that the base current of transistor T2 at this stage is substantially zero):

$$dQ(3)=Ci\cdot(Us(2)+Ube1-Ube2)$$

Figure 3A:
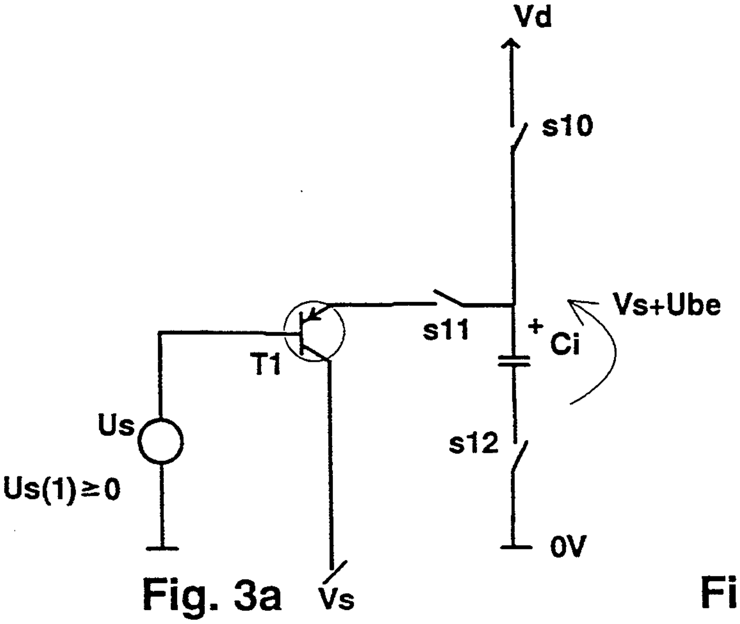
FIGS. 3*a*, 3*b*, 3*c*, 3*d*, and 3*e* show a practical implementation of another embodiment of the present invention, whereby FIGS. 3*a*, *b*, *d*, *e* present only the essential components for each operation stage.
Figure 3B:
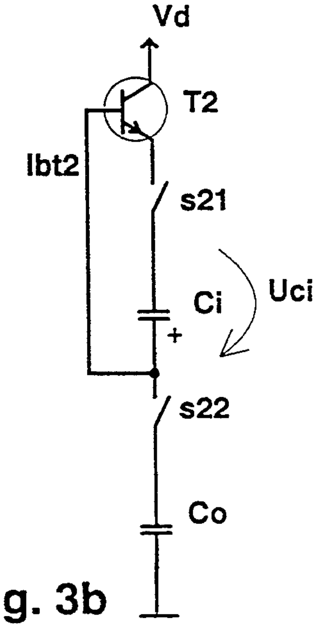
Figure 3C:
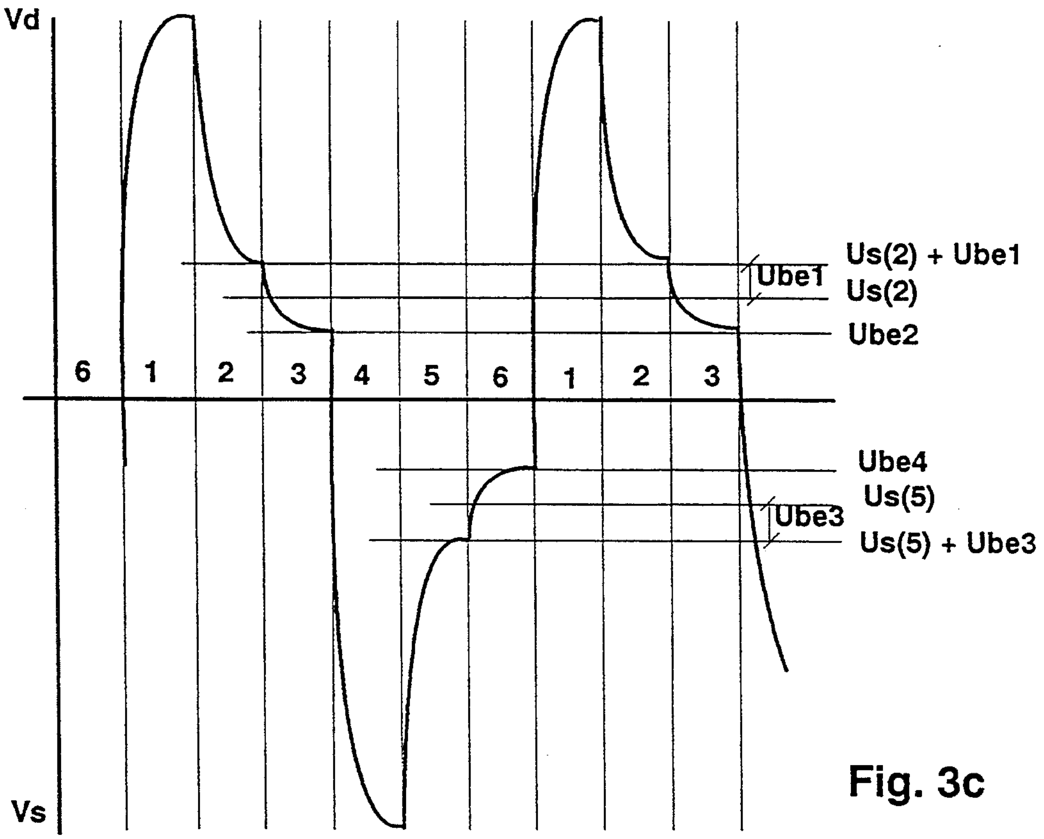
Figure 3D:
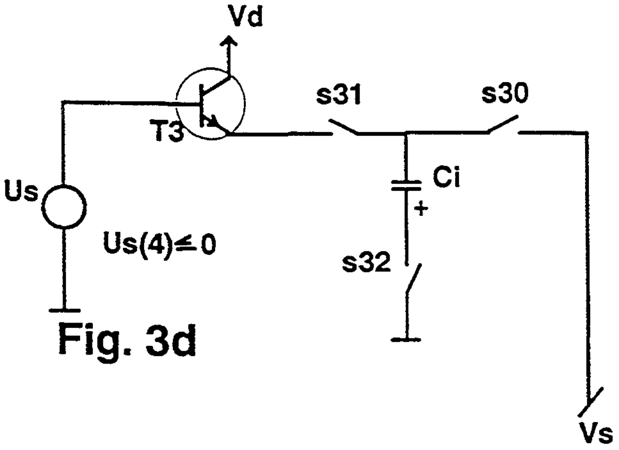
Figure 3E:
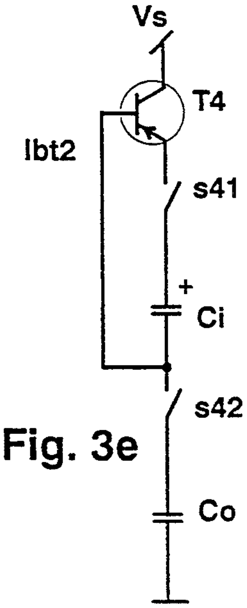

When the transistors T1 and T2 base emitter voltages Ube1 and Ube2 are equal, the circuit integrates the charge dQ(2)=Ci×Us(2) produced by the input voltage Us into integrating capacitance Co. The stages 2 and 3, which correspond to the first and second stages described in relation to FIG. 2, require the signal voltage Us to be positive, because of the polarity of transistors T1 and T2. If Us is negative, the voltage of Ci remains lower than Ube1 during stage 2, and lower than Ube2 during stage 3, which causes the transistor T2 to remain unconductive during stage 3. Therefore, no charge is transferred to the Co during stages 1 to 3 if Us is negative. The voltage across capacitor Co during stages 1 to 3 is shown in FIG. 3*c*.

The negative signal voltage Us is processed at stages 4, 5, and 6, these being equivalent to the first and third stages discussed in relation to FIG. 2. During stage 4, shown in FIG. 3*d*, the charging capacitor Ci is charged to voltage Vs (the negative supply voltage). During stage 5, switches s31 and s32 are closed so the voltage charged into the sampling capacitor Ci is Uci(3)=Us−Ube3, where Ube3 is the base emitter voltage of the transistor T3. At stage 6 (FIG. 3*e*) the charge of the sampling capacitor Ci is discharged into the integrating capacitor Co, whereby switches s41 and s42 are closed so transistor T4 is connected to negative supply voltage Vs. After the termination of the discharge, the base emitter voltage Ube4 remains in the capacitor Ci, hence the charge transferred into the integrating capacitor is:

$$dQ(6)=Ci\cdot(Us(5)=Ube3+Ube4)$$

When the transistors T3 and T4 base emitter voltages Ube3 and Ube4 are equal, the circuit integrates t e input voltage Us into the capacitance Co. The integration circuit shown in FIG. 3 is preferable to the prior art because it consumes current only when sample charges are stored and discharged during stages 1 to 6. There may be pauses between the stages during which the circuit does not consume any current. In the implementation of the circuit like the one shown in FIG. 3 care has to be taken that the base emitter voltages of the transistor pairs T1/T2 and T3/T4 are selected to be equal. Similarly, the circuits must be dimensioned so the base currents of transistors T2 and T4 controllably generate charging and discharging of the sampling capacitor Ci. This factor has been tested and found to exert a diminishing effect on the integration coefficient (order of magnitude less than 1%). The charge of the integrating capacitor Co is not affected by the base currents.

It is useful to examine how the balance of the base emitters voltages are affected where the input signal Us=0, as shown in FIG. 3. In this case, the charge:

$$\begin{aligned} dQp &= Ci\cdot(Ube1-Ube2), && \text{if } Ube1 > Ube2 \\ &= 0 && \text{if } Ube1 \leqq Ube2 \end{aligned}$$

is added to the integrating capacitor Co during stages 2 and 3 and the charge:

$$\begin{aligned} dQn &= -Ci\cdot(Ube3-Ube4), && \text{if } Ube3 > Ube4 \\ &= 0 && \text{if } Ube3 \leqq Ube4 \end{aligned}$$

is added to the Co during stages 3 and 4.

As shown in FIG. 3*c*, the base emitter voltage Ube1 is in the direct integrator approximately equal to Ube3, and Ube2 is approximately equal to Ube4; hence, of the charge differences dQn, dQp presented above, only one is integrated together with the signal value to the integrating capacitor Co. Therefore, asymmetric nonlinearity may occur in the integrator if the base emitter voltages in the pairs are different from one another.

An inverted integrator can be obtained from the circuit shown in FIG. 3 by reversing the order stages 3 (FIG. 3*b*) and 6 (FIG. 3*e*) are performed. Thus, Ube1=Ube2 and Ube3=Ube4 when there is no nonlinearity, as mentioned above. The inverted integrator is shown in its entirety in FIG. 4, but the transistors T1 and T3, and transistors T2 and T4, are combined into transistors T5 and T6 by using switches. The samplings to be taken from the input signal Us are conducted into the sampling capacitor Ci at different stages via transistor T5 or T6. They are then discharged into the integrating capacitor Co via the same transistor, i.e., either T5 or T6.

Figure 4:
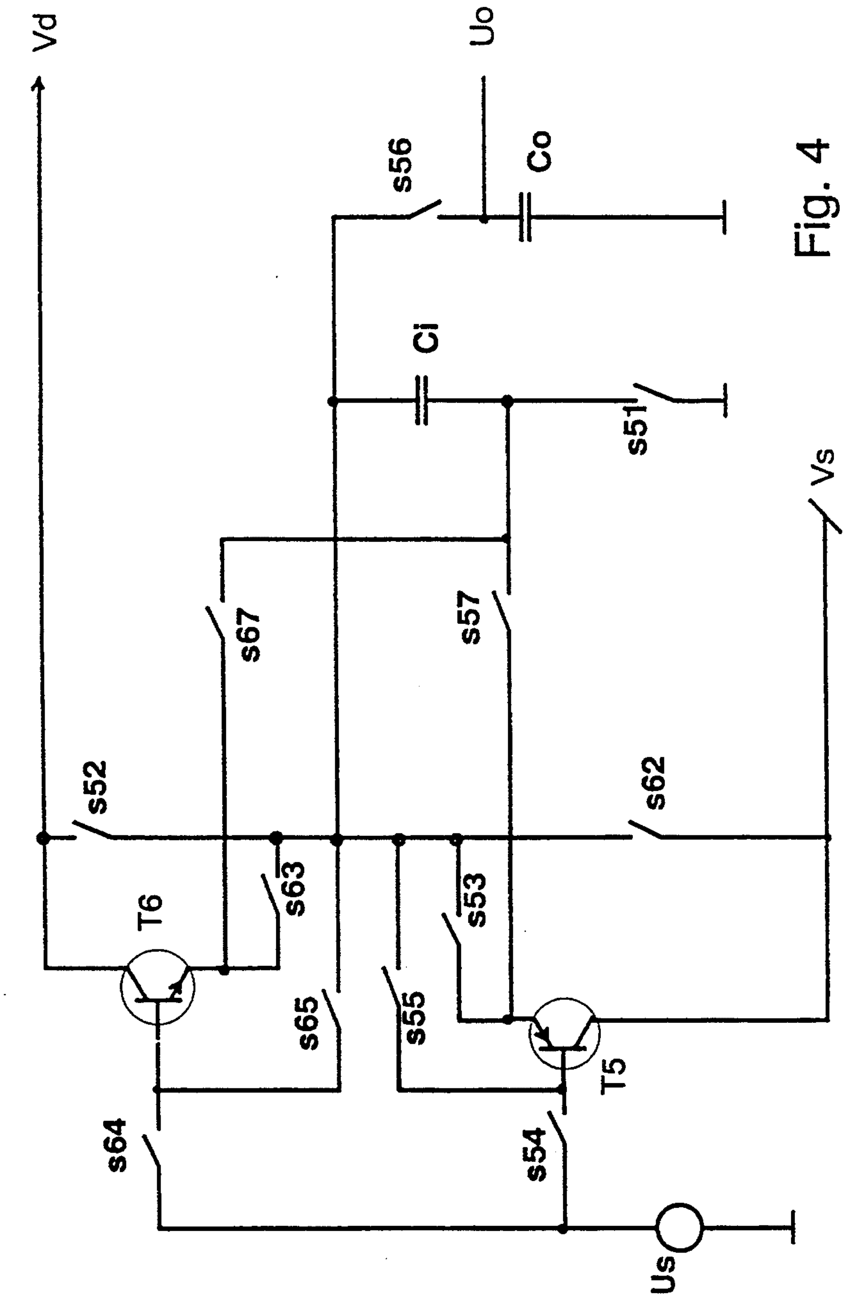
FIG. 4 shows a simplified circuit diagram of the inverting integrator according to a preferred embodiment of the invention, based on a complementary pair of transistors and switches.

To fully understand the operation of the integrating circuit shown in FIG. 4, the operation of the switches is controlled by preselected operation frequency of a clock circuit (not shown). The switches status during each stage is in the table below. An "x" refers to a closed switch and a blank to an open switch.

| Switch | Stages 1 | 2 | 3 | 4 | 5 | 6 | 1 |
|---|---|---|---|---|---|---|---|
| s51 | x | x |  | x | x |  | x |
| s52 | x |  |  |  |  |  | x |
| s53 |  | x |  |  |  |  |  |
| s54 |  | x |  |  |  |  |  |
| s55 |  |  |  |  |  | x |  |
| s56 |  |  | x |  |  | x |  |
| s57 |  |  |  |  |  | x |  |
| s62 |  |  |  | x |  |  |  |
| s63 |  |  |  |  | x |  |  |
| s64 |  |  |  |  | x |  |  |
| s65 |  |  | x |  |  |  |  |
| s67 |  |  | x |  |  |  |  |

At stage 2 a sample of the input signal Us is read into the sampling capacitor Ci via switch s54, transistor T5, and switch s53. One terminal of sampling capacitor Ci is grounded via switch s51. At stage 3, the capacitors are coupled via switch s56 so the sample is discharged into the integrating capacitor Co. Transistor T6 is connected .to the positive voltage supply Vd and the other terminal of charging capacitor Ci is connected to T6 via switch s63. Discharging is continued until the voltage of the capacitor Ci reaches the base emitter voltage of transistor T6 because the base of the transistor T6 is now coupled to a point between the capacitors Ci and Co via switch s65. At stage 4, the sampling capacitor is precharged to the negative supply voltage Vs. At stages 5 and 6, the sample is read and discharged as above but now via transistor T6. At stage 1 the capacitor Ci is recharged to the positive supply voltage, whereby a new cycle starts again.

Figures 5A, 5B:
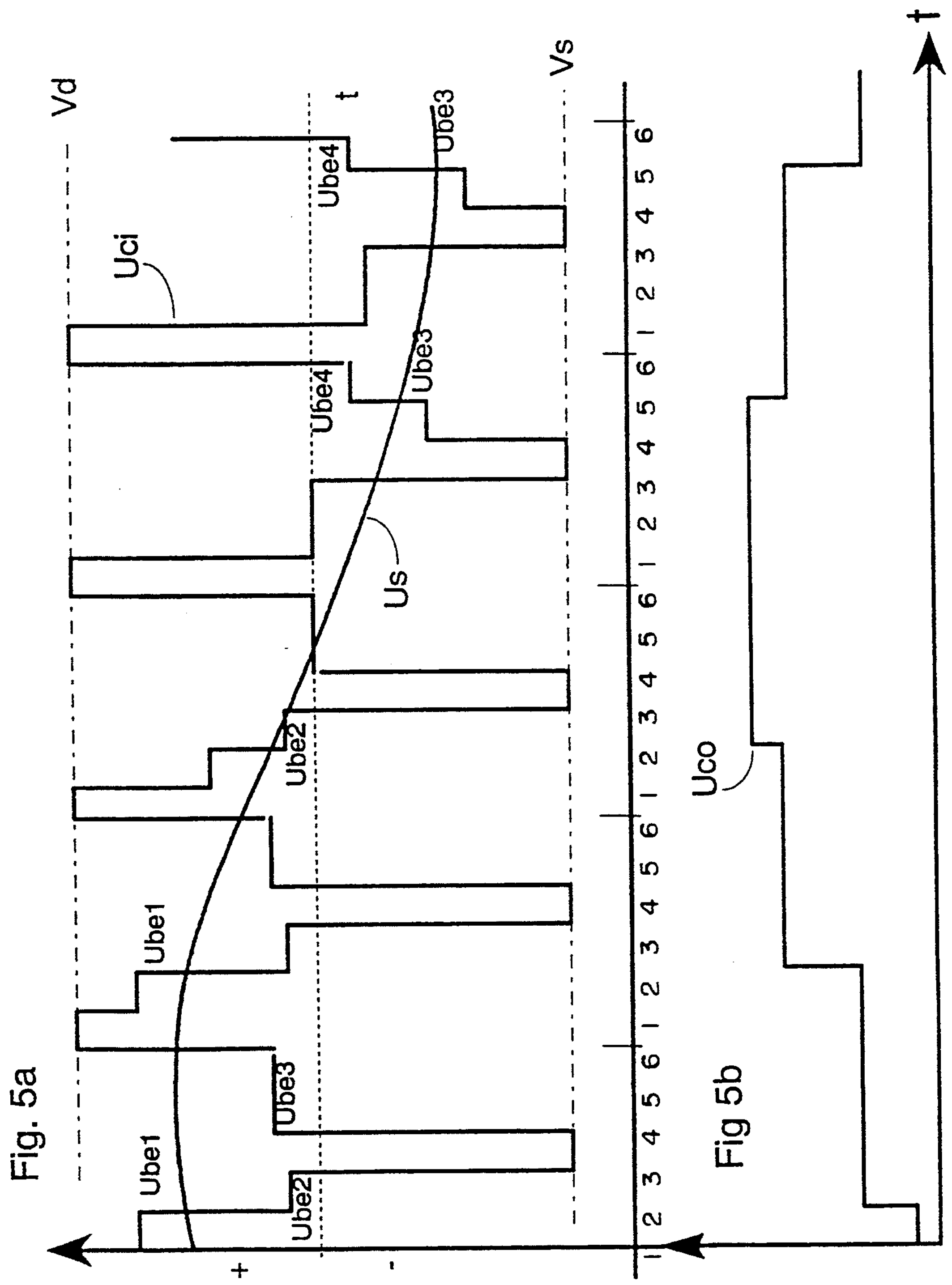
FIGS. 5*a* and 5*b* illustrate the operation of the circuit shown in FIG. 4.

The operation of the circuit according to FIG. 4 is demonstrated in FIGS. 5*a* and 5*b* where the connections between the input signal Us, the voltage Uci across the sampling capacitor Ci, and the voltage Uco affecting over the integrating capacitor are presented as a function of time. On the time axis between FIGS. 5*a* and 5*b* is marked the order of stages 1–6. FIG. 5 is intended to clarify the operating principle of the invention, therefore the voltage graphs are not exactly to scale. It is seen that the output voltage Uco (FIG. 5*b*) is the integral of the input signal Us (FIG. 5*a*).

Figure 1A:
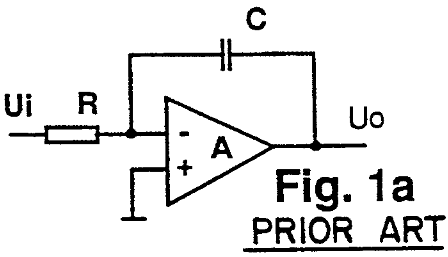
Fig. 1a PRIOR ART
FIGS. 1*a* and 1*b* show prior art integrating circuits.
Figure 1B:
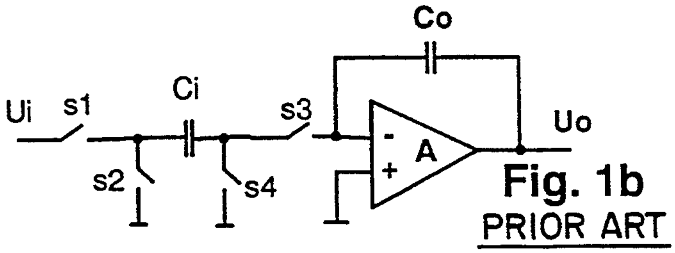
Fig. 1b PRIOR ART

Since in the circuit of FIG. 4, each switch s only processes either positive or negative voltage, the switches can be implemented in a manner known in the art to use only one transistor for each switch so that the circuit of FIG. 4 is simpler than the circuit shown in FIG. 1*b*.

From the circuit shown in FIG. 3, a simple full wave rectifier is obtained so that instead of stage 6 (FIG. 3*e*), stage 3 is carried out and the integrating capacitor Co is set to zero prior to each integration step, unless the integration of the rectified voltage is desired. Inverting the stages can also be carried out by performing the steps in reverse order, i.e., stage 6 is performed instead of stage 3. The circuit can easily be transformed into an amplifier. A preferred circuit is an inverted amplifier free from non-ideal features.

The circuit's power consumption can be further decreased by, for example, not carrying out those clock stages which are passive according to the signal (e.g., polarity positive or negative) and not precharging the sampling capacitance Ci.

The circuit in FIG. 4 charges and discharges stages using the same transistor, i.e., either T5 or T6, no potential non-ideality observed in FIG. 3 is associated with an individual sample. However, special care has to be taken that the circuit make the base emitter voltages of PNP/NPN transistors T5, T6 the same, otherwise instability may occur in the vicinity of the zero cross-over points of the signal, for example, repetition of the voltage difference in one direction only. The circuit of FIG. 4 meets the criteria presented at the beginning so that it will not consume any current between the storing and discharging periods.

The circuit shown in FIG. 4 may be further enhanced by an inverted integrator in which the non-ideality caused by the threshold voltage differences of the NPN and PNP FET transistors is eliminated so that the threshold voltages of the transistors are made equal. Moreover, if the threshold voltage is zero, the completely separate processing of the negative and positive signal samples can be avoided.

Figure 6:
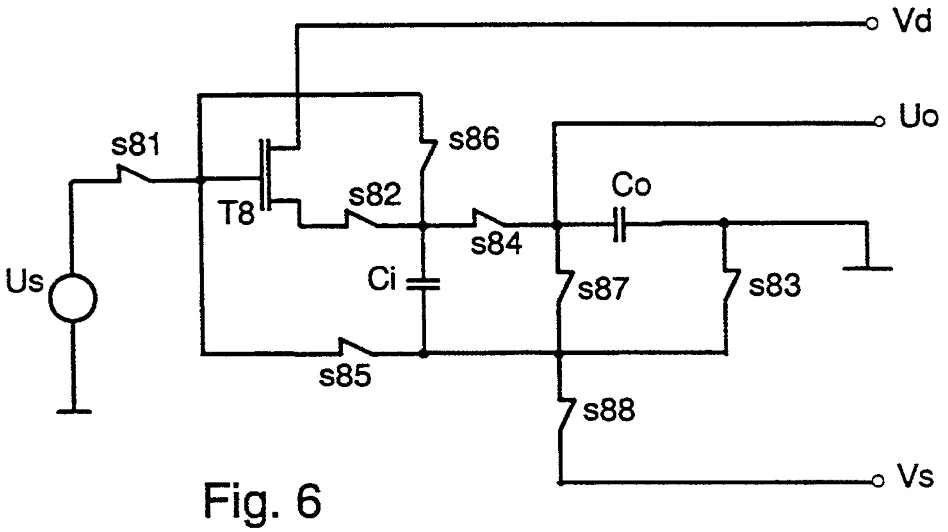
FIG. 6 shows a simplified circuit diagram of the inverting integrator as shown in FIG. 4 except an ideal CMOS switch is used for the integration cell.

The inverting integrator shown in FIG. 6 is based on a CMOS transistor. A sample from the input signal Us is read into the sampling capacitor Ci via transistor T8 and switches s81–s88. The sample is then sent to the integrating capacitor Co, which capacitor has one terminal coupled to the output where the inverted, integrated output signal Uo is obtained. The other terminal S (FIG. 7) of the transistor T8 is connected to the positive supply voltage Vd.

In the switch table describing the operation of the circuit shown in FIG. 6, x at each stage 1 to 4 refers to a closed switch. At non-marked stages the switch is open:

| Switch | Stages 1 | 2 | 3 | 4 |
|---|---|---|---|---|
| s81 | x | | | |
| s82 | x | | | |
| s83 | x | | | |
| s84 | | x | | |
| s85 | | x | | x |
| s86 | | | x | |
| s87 | | | x | |
| s88 | | | | x |

Figure 7:
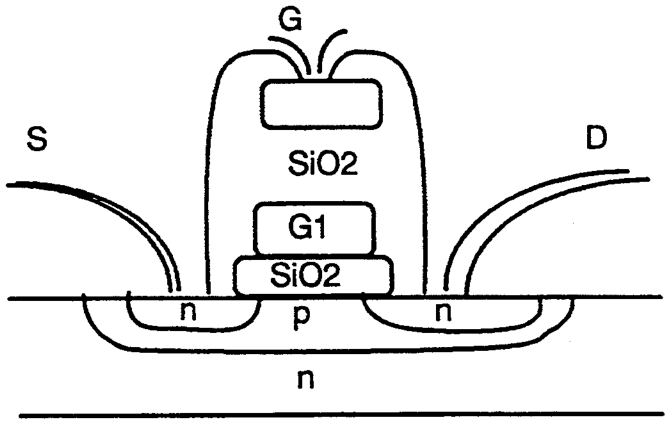
FIG. 7 shows the principle design of the ideal switch of FIG. 6 using an EPROM transistor.

The operation of the circuit in FIG. 6 differs from the one in FIG. 5 in that both the positive and negative samples are processed at the same sampling stage. Stage 1 stores samples in the capacitor Ci, stages. 2 and 3 discharge the samples depending on the terminal of the sample into the capacitor Co, and stage 4 charges the floating grid G1 of the transistor T8 (FIG. 7). At the charging stage (stage 4), the floating grid G1 of the transistor T8 is arranged to carry a predetermined charge which, in the case shown in FIG. 6, is brought to the grid G (FIG. 7) from the ground potential.

The transistor T8 shown in FIG. 6 is provided with a slightly unusual structure which is briefly described by the illustration in FIG. 7. The purpose of the figure is merely to demonstrate the principle structure with an enlarged cross-sectional diagram; therefore, the figure is not to scale. The transistor is produced using, e.g., the EPROM process known in the art. The CMOS transistor shown in FIG. 7 is provided with the following couplings: supply S, throat D, and grid G. Isolated between the grid G and base SUB is positioned the floating grid G 1. At the charge stage 4 shown in FIG. 6, the floating grid G 1 is arranged to carry a predetermined charge. Due to the floating grid, asymmetries possibly caused by conventional bipolar and FET transistors are avoided in the integrated circuit. A person skilled in the art understands with the aid of the figure the rest of the principle structure of the transistor and the other features of its operation. The transistor according to FIG. 7 may also be used in integrated circuits like those shown in FIGS. 2, 3, and 4, whereby their potential asymmetries change respectively. The circuit shown in FIG. 6 is, however preferable because there are less switching elements than in circuits 2, 3, and 4.

With the aid of the circuits disclosed, filters, rectifiers, modulation detectors, and other signal processing connections can be implemented. The operation of the circuits requires equal base emitter voltages of the PNP and NPN transistors, which is obtainable, especially when the connection is a single integrated circuit.

A great advantage of the integrated circuits of the invention is that they do not consume any static current. In addition, the circuits have only small noise level and a wide dynamics range. The circuit of the claimed invention using an integrated circuit requires only half of the space of what the designs known in the art require. These advantages make the invention ideal for small portable appliances, such as data detection and data filtering circuits of radio search apparatus, speech processing circuits or modem circuits of radio telephones, and in other micro power applications.

The power consumption P of the circuit according to the present invention is approximately obtained by the formula $P=U^2\times Ctot\times fs$. For example, if U is the supply voltage 5 V, Ctot is the total capacitance 50 pF of the capacitor (Ci) of connectable a ten pole filter, and fs is switch frequency 100 kHz. Thus, the power consumption $P=125\ \mu W$, or order of magnitude of $10\ \mu W$ per pole which can be regarded very small.

The above described embodiment examples are only intended to illustrate the inventive idea for which the person skilled in the art may after reading the above specification be able to develop several modifications. The protective scope of the invention is therefore only limited by the claims below.

What is claimed is:

1. A method for producing either one of an inverted and a direct time integral of a signal voltage, comprising the steps of:

a. selectively connecting a sampling capacitance to the signal voltage;

b. precharging the sampling capacitance by selectively connecting the sampling capacitance to one of a positive and a negative supply voltage;

c. storing charge samples representing the signal voltage in the precharged sampling capacitance while connected;

d. switching switch elements at predetermined intervals to selectively connect the sampling capacitance to an integrating capacitance;

e. discharging the charge samples from the sampling capacitance to the connected integrating capacitance while connected;

f. isolating the integrating capacitance after the sample charge has been fully discharged; and g. selecting timing of the switching elements so that current flows in the circuit only when one of the steps of storing and discharging is being performed.

2. A method for producing either one of an inverted and a direct time integral of a signal voltage, comprising the steps of:

a. selectively connecting a sampling capacitance to the signal voltage;

b. precharging the sampling capacitance by selectively connecting the sampling capacitance to one of a positive and negative supply c. storing charge samples representing the signal voltage in the precharged sampling capacitance while connected;

d. switching switch elements at predetermined intervals to selectively connect the sampling capacitance to an integrating capacitance;

e. discharging the charge samples from the sampling capacitance to the connected integrating capacitance while connected;

f. isolating the integrating capacitance after the sample charge has been fully discharged;

g. selecting timing of the switching elements so that current flows in the circuit only when one of the steps of storing and discharging is being performed; and h. controlling the storing and discharge of charge samples with an active member, said step of controlling including the step of connecting the active member to any one of a positive voltage supply, negative voltage supply, and ground.

3. A method for producing either one of an inverted and a direct time integral of a signal voltage, comprising the steps of:

a. selectively connecting a sampling capacitance to the signal voltage;

b. precharging the sampling capacitance by selectively connecting the sampling capacitance to one of a positive and negative supply c. storing charge samples representing the signal voltage in the precharged sampling capacitance while connected;

d. switching switch elements at predetermined intervals to selectively connect the sampling capacitance to an integrating capacitance;

e. discharging the charge samples from the sampling capacitance to the connected integrating capacitance while connected, said discharging of the charge samples occurring in two stages:

1. a first stage conducting the sample charge to the integrating capacitance only when the sample charge has a first predetermined polarity, and 2. a second stage conducting the sample charge to the immigrating capacitance only if the sample charge has a second, opposite predetermined polarity;

f. isolating the integrating capacitance after the sample charge has been fully discharged; and g. selecting timing of the switching elements so that current flows the circuit only when one of the steps of storing and discharging is being performed.

4. The method of claim 3, further comprising the step of identifying the polarity of the charge of the sampling capacitance before the discharging step.

5. The method of claim 3, wherein the step of discharging further includes performing only the first stage of said two stages if the sample charge has the first predetermined polarity and only the second stage if the sample charge has the second, opposite predetermined polarity.

6. A method for producing either one of an inverted and a direct time integral of a signal voltage, comprising the steps of:

a. selectively connecting a sampling capacitance to the signal voltage;

b. precharging the sampling capacitance by selectively connecting the sampling capacitance to one of a positive and negative supply c. storing charge samples representing the signal voltage in the precharged sampling capacitance while connected;

d. switching switch elements at predetermined intervals to selectively connect the sampling capacitance to an integrating capacitance;

e. discharging the charge samples from the sampling capacitance to the connected integrating capacitance while connected, said discharging occurs for sample charges having either one of a first and a second predetermined polarity;

f. isolating the integrating capacitance after the sample charge has been fully discharged; and g. selecting timing of the switching elements so that current flows in the circuit only when one of the steps of storing and discharging is being performed, whereby the signal voltage is rectified.

7. The method of claim 6, further including the step of integrating the rectified signal voltages.

* * * * *